United States Patent [19]

Schröder-Brumloop et al.

[11] Patent Number: 5,272,398

[45] Date of Patent: Dec. 21, 1993

[54] DRIVER FOR POWER FIELD-CONTROLLED SWITCHES WITH REFRESHED POWER SUPPLY PROVIDING STABLE ON/OFF SWITCHING

[75] Inventors: Helmut L. Schröder-Brumloop; Sven-Oliver R. Kersten, both of Berlin, Fed. Rep. of Germany

[73] Assignee: Otis Elevator Company, Farmington, Conn.

[21] Appl. No.: 758,057

[22] Filed: Sep. 12, 1991

[51] Int. Cl.[5] .................... H03K 17/00; H03K 17/14; H03K 17/687

[52] U.S. Cl. ................ 307/571; 307/296.4; 307/572; 307/584

[58] Field of Search ........... 307/571, 572, 584, 491, 307/296.1, 296.3, 296.4

[56] References Cited

U.S. PATENT DOCUMENTS

| | | | |
|---|---|---|---|
| 4,686,386 | 8/1987 | Tadao | 307/296.3 |
| 5,111,084 | 5/1992 | Suko | 307/571 |

FOREIGN PATENT DOCUMENTS 0002704  1/1990  Japan ................... 307/571

*Primary Examiner*—John Zazworsky
*Attorney, Agent, or Firm*—Breffni X. Baggot

[57] ABSTRACT

Drivers for field-controlled switches are powered and switched on and off by the same combined command and power signal which consists of a command signal modulated by a clock signal forming a command envelope including a train of clock pulses. The invention prevents power from being lost by refreshing power during the PWM low state, such that the command high state pulses need not be used for restoring power. Power and a command to a field-controlled driver is provided by a combined command power signal consisting in the on-state of clock pulses, the groups being a function of switch signal pulse width, and in the off-state of absence of clock pulses. During the off-state of the driver, power is refreshed. In addition, by integration the clock pulses a dead time occurs within the driver circuit, while the driver is being switched on with different time constants.

5 Claims, 1 Drawing Sheet

DRIVER FOR POWER FIELD-CONTROLLED SWITCHES WITH REFRESHED POWER SUPPLY PROVIDING STABLE ON/OFF SWITCHING

TECHNICAL FIELD

This invention relates to inverter drivers for power field-controlled switches. The invention refreshes the power of the driver when a command signal to the drive is in the off-state, thereby providing a stable power supply to the driver.

BACKGROUND OF THE INVENTION

MOSFET refers to a metal oxide semiconductor field effect transistor or any other similar semiconductor switch having very high input impedance as compared to bi-polar transistors. The power transistor has a control terminal which, in the case of the bi-polar transistor, is referred to as the base and in the case of the MOSFET, is referred to as the gate.

Field-controlled switches, including power MOSFETs and IGBTs include a capacitance known as the Miller capacitance $C_M$ between the drain and gate and a second capacitance $C_1$ between the gate and source. To turn on a field-controlled switch, the gate-source capacitor $C_1$ must be charged and the Miller capacitor $C_M$ discharged. To turn off the field-controlled switch, a discharge of the gate-source capacitor $C_1$ is necessary and the Miller capacitor must be charged. A field-controlled switch can be supplied with voltage from a driver which receives both a power signal and a switching signal in the form of a combined switching power signal. This switching power signal consists of a positive pulse train to the driver. During the off-state, the driver leaks energy. This energy is needed to power the driver to put it in a state where it is capable of providing a combined an ON/OFF command signal to the field-controlled switches, for example, in an inverter leg. The off-state leakage currents discharge the driver. This causes the operation of active components (transistors and ICs) to be weak and unstable; that is, the active components produce less current and voltage and also switch state without being commanded to do so. Presently, the first pulse in the pulse train is used to restore power to the driver which was lost through leakage.

One result of the weak and unstable state is spurious transitions. Power MOSFETs in their non-conducting condition are subject to a spurious turn-on if the drain-source voltage changes with a high rate of change. Also, a power MOSFET switch presently conducting may spuriously turn off if its gate charge is permitted to discharge during its conducting interval. These spurious transitions are subject to both external circuit conditions and to parasitic elements of the MOSFET. While an unwanted transition of the MOSFET from the on-state to the off-state may be damaging to the performance of an overall power system, a spurious transition from the off-state to on-state is frequently severely damaging to the MOSFET and may cause its destruction. One solution to alleviate this problem is disclosed in U.S. Pat. No. 4,748,351, "Power MOSFET Gate Driver Circuit" by Barzegar. Barzegar teaches utilizing a gate drive circuit to control conductivity of a power MOSFET. There the drive isolates the gate from noise signals and provides an initial positive bias to turn on the power MOSFET into conduction until a specific turn off bias signal is applied. However, the positive bias is produced with the aid of an additional control MOSFET. While, the solution prevents spurious turn operation of the power MOSFET, it does so by adding as a solving component the vary element that is susceptible to spurious operation—a MOSFET.

Field-controlled switches need to have a stable power supply and also need to be kept off during a dead time if the switch is to be used in an inverter. To provide the dead time (the time after the turning off of one switch before the turning on of the complementary switch, during which neither switch is on) for the inverter, separate circuitry outside the driver is required, as shown in U.S. Pat. No. 4,554,512 "Switching Amplifier with MOSFET Driver Circuit".

DISCLOSURE OF THE INVENTION

According to the present invention, power and a command to a driver for a field-controlled switch are both provided in a command power signal consisting in the on-state of clock pulses and in the off-state by the absence of clock pulses. During the off-state of the driver, power to the driver is refreshed. In addition, a dead time between switching of two switches in an inverter leg occurs within the drive while the driver is being switched on by integrating the clock pulses with an integrator having more than one time constant.

It is a first object of the present invention to eliminate unstable performance of a field-controlled switch caused by off-state leakage currents in the driver by refreshing power to a driver during an off-state of a command signal provided to the driver, thereby providing a stable power supply.

It is a second object to provide an inverter in which the dead time occurs in a driver to a field-controlled switch during the rise time of the driver on state.

These and other objects, features and advantages of the present invention will become more apparent in light of the following detailed description of a best mode embodiment thereof, as illustrated in the accompanying drawing.

DETAILED DESCRIPTION OF THE INVENTION

Figure 1:
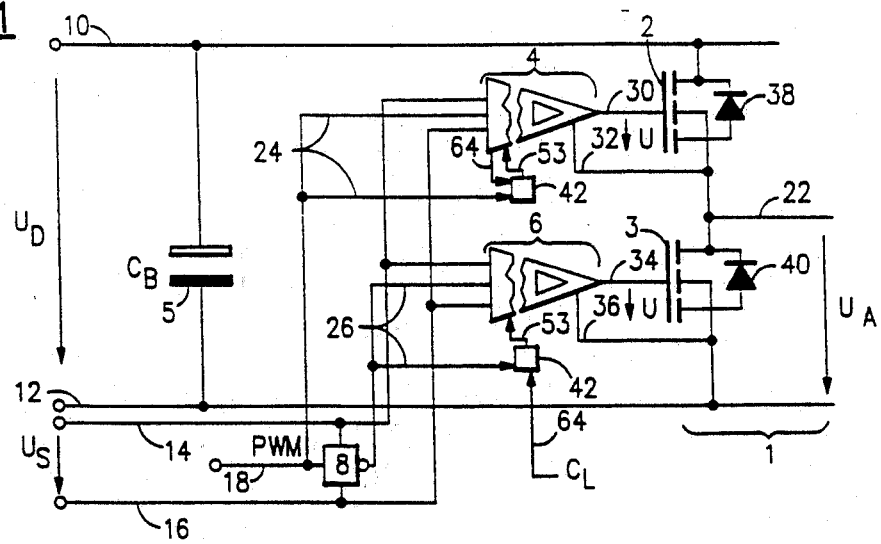
FIG. 1 is a schematic of a leg of an inverter employing the present invention.

FIG. 1 shows a leg 1 of an inverter (not shown) comprising, two complementary MOSFETs 2, 3, two drivers 4, 6, one associated with each of the switches 2, 3, a buffer capacitor 5, and a first NOT gate 8. Although the invention applies to all field-controlled switches, the present explanation is made in terms of MOSFETs.

The inputs to the circuit of FIG. 1 are three: a 220 DC bus voltage $U_D$ applied across bus bar lines 10, 12, a five-volt supply $U_S$ applied across lines 14, 16, and a PWM voltage signal applied on line 18. The inverter bridge leg 1 controls its output 22 to be on either the positive (line 10) or negative bus bar (line 12). The scope of the present invention includes all command signals used for controlling a field-controlled switch, including the PWM signal described here. All signals designated PWM, here, may alternately be named command signals.

Across the buffer capacitor 5 is applied the 220 DC voltage $U_D$. The purpose of the buffer capacitor 5 to the act as a buffer between the 220 voltage source supply $U_D$ and the leg 1, thereby preventing spikes in $U_D$ from destroying the MOSFET 2, 3. Voltages greater than 220 are discharged through the buffer capacitor 5.

The drivers 4, 6 are each responsive to the five-volt DC supply $U_S$. In addition, the first driver 4 is responsive to the PWM voltage signal provided on line 24 while the second driver 6 is responsive, on a line 26 from a NOT gate 8, to the complement of the PWM voltage signal. The two drivers 4, 6 each provide a driver signal, in the form of a gate-to-source voltage, to their respective MOSFETs 2, 3 across lines 30, 32 and 34, 36, respectively. The MOSFETs 2, 3 include freewheeling diodes 38, 40 for conducting current after the corresponding switch 2, 3 have been turned off. During shut-down of one of the switches 2, 3, the flywheel diode 38, 40 associated with the switches 2, 3 conducts the current required to discharge the energy stored in, for example, a motor inductance. From the driver 4, a clock signal $C_L$ on a line 64 is provided to a refresh circuit 42; the driver 4 receives a refresh signal on a line 53 from the refresh circuit 42. The clock signal $C_L$ is also provided to the driver 6. The refresh circuit 42 associated with the driver 4 receives a PWM signal on a line 24 and the refresh circuit 42 associated with the driver 6 receives on a line 26 the complement of the PWM signal.

Figure 2:
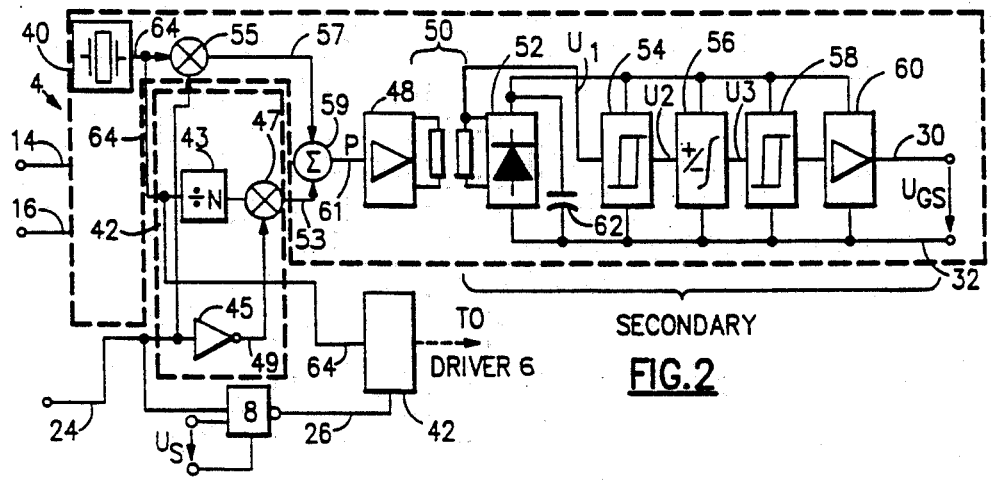
FIG. 2 is a block diagram of the driver of the present invention.

FIG. 2 shows the driver 4, the refresh circuit 42, the first NOT gate 8, and a refresh circuit 42 for the driver 6. The driver 4 comprises a clock 40, a multiplier 55, a transformer driver 48, a pulse transformer 50, a rectifier 52, a first hysteresis comparator 54, an integrator 56, a second hysteresis comparator 58, an amplifier 60, and a power supply capacitor 62. Both drivers 4, 6 share the same clock 40. A capacitor 62 is provided across the rectifier 52 for providing voltage to the secondary side of the driver 4. The secondary side of the driver includes the secondary side of the pulse transformer 50, the rectifier 52, the capacitor 62, the first hysteresis comparator 54, the delay time integrator 56, the second hysteresis comparator 58 and the amplifier 60. That portion of the driver 4 which is not the secondary side is the primary side. All circuit elements in FIG. 2, with the exception of the current transformer 50 and the supply capacitor 62 are powered by the five-volt supply $U_S$.

In FIG. 2, the clock 40 provides a square wave clock signal $C_L$ on a line 64 to the refresh circuit 42. The refresh circuit 42 includes a divide-by-n clock 43, a second NOT gate 45, and a multiplier 47. The second NOT gate 45 inverts the PWM signal and provides a PWM complement signal on a line 49 to the multiplier 47. In addition, the divide-by-n clock 43 divides the clock signal $C_L$ by n and provides a divided clock signal $C_{Ln}$ on a line 51 to the multiplier 47 for multiplying the PWM complement signal and providing a refresh signal on a line 53.

In addition to providing the clock signal $C_L$ to the refresh circuit 42, the clock signal $C_L$ is provided to a multiplier 55 for multiplying the PWM signal and providing a PWM envelope on a line 57 to a summer 59 for summing with the refresh signal and providing a command power signal P on a line 61.

The command power signal P is provided to a transformer driver 48 where the command power signal P is amplified. The pulse transformer 50 isolates the primary side of the driver from $U_D$. From the pulse transformer 50, a transformed, command power signal is provided to a rectifier 52. The rectified, transformed command power signal $U_1$ is then provided to a first hysteresis comparator 54 where its triangle-like waveform is converted into a square wave $U_2$ for integration in the delay time integrator 56. The square wave $U_2$ is shown as a squared refresh signal waveform 75 and a PWM envelope 76 including a number of pulses. The shape of the squared refresh signal waveform 75 and each of the pulses in the PWM envelope 76 is substantially similar. For the MOSFET 2 to turn on, the output $U_3$ of the delay time integrator 56 must exceed a threshold.

The integration time constant for the beginning portion of the square wave $U_2$ is greater than that for the latter portion. This time constant difference is needed because the integral of the square wave should not exceed the turn-on voltage until the dead time $t_d$ has passed; the dead time $t_d$ is provided in the driver 4 by selecting the integral time constant. The time constant difference occurs because the absence of pulses (PWM off) is detected faster than reaching a threshold after the start of a pulse chain; conversely, the delay time integrator 56 output $U_3$ rises to the threshold more slowly in response to the pulses at the beginning of the waveform 78 than it falls below that threshold in response to the absence of any pulses at the end of waveform 78. The result of the different time constants is most clearly seen in the waveform $U_{GS}$ lagging the PWM signal by a time $t_d$ which is longer than the time $t_{off}$ used for turning off the MOSFET. This means that, because a MOSFET 2 will not turn on until $t_d$ after the PWM signal, one MOSFET will be off before its complement turns on and therefore there can be no short circuit across the leg 1.

For the same reason, length of time constants, the delay time integrator 56 suppresses the refresh signal and disturbances (spikes caused by noise and/or logic malfunctions). The integrator ensures that the refresh signal does not switch the MOSFET 2 on or off; the integral of the refresh pulse is too small to turn the MOSFET 2 on or off. As much of the integrated signal $U_3$ as exceeds the switching level of the second hysteresis comparator 58 during the "on" portion of the PWM signal, is provided from that comparator 58 to an amplifier 60 excessive voltage absorbed by. The voltage $U_{GS}$ is the gate-to-source voltage applied to the gate of the MOSFET 2.

Figure 3:
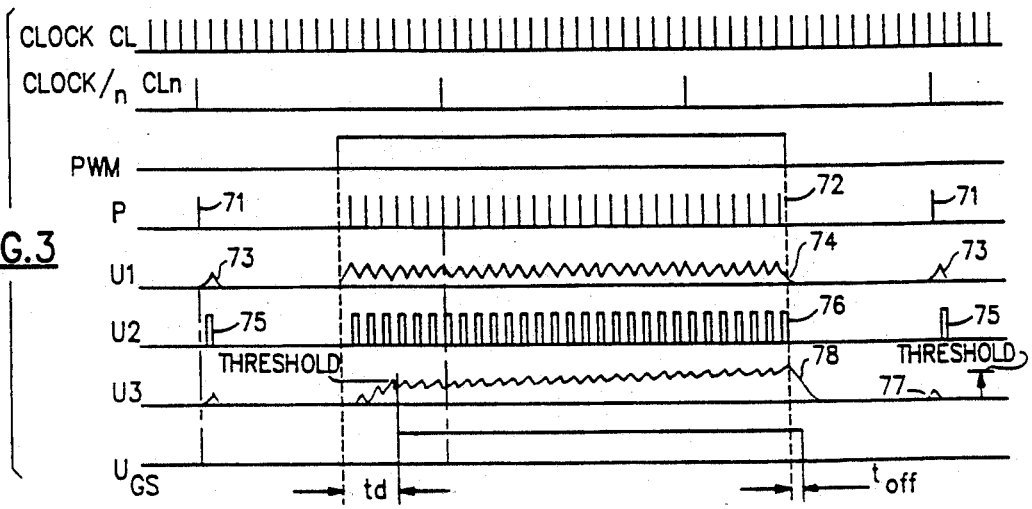
FIG. 3, on a common time line, shows the waveforms in the driver of FIG. 2.

On a common time line, FIG. 3 shows the clock pulse $C_L$, PWM voltage signal, the command power signal P, the rectified command power signal $U_1$, the square wave $U_2$, the integrated square wave $U_3$, and the gate-to-source voltage $U_{GS}$ applied as a drive signal to the MOSFET.

The command power signal P is shown as the sum of a waveform 71, representing a refresh signal, and a waveform 72, representing a PWM envelope. The rectified, transformed, command power signal $U_1$ is shown as the sum of a rectified, transformed refresh waveform 73 and a rectified, transformed PWM envelope waveform 74. The square wave $U_2$ is shown as a squared refresh signal waveform 75 and a PWM envelope 76. The integrated signal $U_3$ similarly shows the refresh component and envelope component of the original common power signal as waveform 77, 78. No remnant of the refresh signal appears in $U_{GS}$.

As shown in waveform $U_{GS}$, the dead time $t_d$ is produced by integration of the transformed, rectified clock pulses in the signal $U_2$. The MOSFET turn-off time $t_{off}$ is also shown.

Although the invention has been shown and described with respect to a best mode embodiment thereof, it should be understood by those skilled in the art that the foregoing and various other changes, omissions, and additions in the form and detail thereof may be made therein without departing from the spirit and scope of the invention.

For example, the divide-by-n clock 43 as described here is a divide-by-16 clock. The number n is chosen as a function of the measured leakage of the driver 4. If the leakage is high, n is chosen closer to 1 than, for example, 16 (the number of clock pulses that may fit within a typical PWM envelope). A low n ensures a high number of refresh pulses.

I claim:

1. A method for refreshing power to a driver, said driver being responsive to a clock signal and a command signal, said command signal being in either an on state or an off state, for multiplying said clock signal with command signal, for providing a command envelope signal and providing a drive signal to a field-controlled switch in response to said command envelope signal, comprising the step of:
   providing a refresh signal to said driver in response to said command signal being in the off state.

2. The method of claim 1, wherein said step of a providing a refresh signal further comprises the steps of:
   dividing said clock signal and providing a divided clock signal;
   inverting said command signal and providing a complement signal;
   multiplying said complement signal and divided clock signal.for providing a refresh signal.

3. A method for driving the gate of a field-controlled switch, comprising the steps of:
   providing a clock signal;
   providing a command signal;
   providing a command power signal in response to said command signal and said clock signal, including
      dividing said clock signal for providing a divided clock signal,
      inverting said command signal for providing a complement signal,
      multiplying said divided clock signal by said complement signal for providing a refresh signal,
      multiplying said command signal by said clock signal for providing a command envelope signal;
      summing said refresh signal with said command envelope signal for providing a command power signal;
   providing said command power signal to a pulse transformer for providing a transformed signal in response to said command power signal;
   rectifying said transformed signal and providing a rectified signal in response to said transformed signal;
   integrating said transformed signal and providing an integrated signal in response to said rectified signal; and
   providing said integrated signal to said gate of said field-controlled switch.

4. A device for refreshing power to a driver, said driver being responsive to a clock signal and a command signal, said command signal being in either an on state or an off state, for multiplying said clock signal and said command signal, for providing a command envelope signal and providing a drive signal to a field-controlled switch in response to said command envelope signal, comprising:
   means for providing said command signal in an off state; and
   refresh means for providing a refresh signal to said driver in response to said command signal being in said off state wherein said refresh means further includes:
   dividing means for dividing said clock signal and providing a divided clock signal;
   a NOT gate for inverting said command signal and providing a complement signal; and
   a multiplier for multiplying said complement signal and divided clock signal for providing said refresh signal.

5. A device for driving the gate of a field-controlled switch, comprising:
   a clock for providing clock signal;
   command means for providing a command signal;
   command power means for providing a command power signal in response to said command signal and said clock signal, including
      a divider for dividing said clock signal for providing a divided clock signal,
      a NOT gate for inverting said command signal for providing a complement signal,
      a first multiplier for multiplying said divided clock signal by said complement signal for providing a refresh signal,
      a second multiplier for multiplying said command signal by said clock signal for providing a command envelope signal;
      a summer for summing said refresh signal with said command envelope signal for providing a command power signal;
   means for providing said command power signal to a pulse transformer and providing a transformed signal therefrom;
   a rectifier for rectifying said transformed signal and providing a rectified signal;
   an integrator for integrating said transformed signal and providing an integrated signal; and
   means for providing said integrated signal to said gate of said field-controlled switch.

* * * * *